US012796037B2

(12) United States Patent
Kajiwara et al.

(10) Patent No.: US 12,796,037 B2

(45) Date of Patent: Nov. 10, 2026

(54) SEMICONDUCTOR DEVICE

(71) Applicant: KABUSHIKI KAISHA TOSHIBA, Tokyo (JP)

(72) Inventors: Yosuke Kajiwara, Yokohama Kanagawa (JP); Hiroshi Ono, Setagaya Tokyo (JP); Daimotsu Kato, Kawasaki Kanagawa (JP); Aya Shindome, Yokohama Kanagawa (JP); Masahiko Kuraguchi, Yokohama Kanagawa (JP)

(73) Assignee: KABUSHIKI KAISHA TOSHIBA, Kawasaki (JP)

( * ) Notice: Subject to any disclaimer, the term of this patent is extended or adjusted under 35 U.S.C. 154(b) by 576 days.

(21) Appl. No.: 18/172,856

(22) Filed: Feb. 22, 2023

(65) Prior Publication Data

US 2024/0047534 A1 Feb. 8, 2024

(30) Foreign Application Priority Data

Aug. 8, 2022 (JP) ................................ 2022-126227

(51) Int. Cl.

*H10D 62/824* (2025.01)
*H10D 62/85* (2025.01)
(Continued)

(52) U.S. Cl.

CPC ....... *H10D 62/824* (2025.01); *H10D 62/8503* (2025.01); *H10D 64/516* (2025.01);
(Continued)

(58) Field of Classification Search

CPC ............. H10D 62/824; H10D 62/8503; H10D 64/516; H10D 30/60; H10D 64/513;
(Continued)

(56) References Cited

U.S. PATENT DOCUMENTS 10,256,308 B1 4/2019 Shimizu et al.
11,362,174 B2 6/2022 Shimizu
(Continued)

FOREIGN PATENT DOCUMENTS

JP 2013-140835 A 7/2013
JP 2019-96720 A 6/2019
(Continued)

OTHER PUBLICATIONS

Takuji Hosoi, et al., "Mobility enhancement in recessed-gate AlGaN/GaN MOS-HFETs using an AION gate insulator," Japanese Journal of Applied Physics, vol. 58, pp. SCCD16-1 to SCCD16-6 (2019).
(Continued)

*Primary Examiner* — Marlon T Fletcher
*Assistant Examiner* — Da Wei Lee
(74) *Attorney, Agent, or Firm* — Finnegan, Henderson, Farabow, Garrett & Dunner, LLP

(57) ABSTRACT

According to one embodiment, a semiconductor device includes a first electrode, a second electrode, a third electrode, a first semiconductor region, a second semiconductor region, a first layer, a second layer, and a first insulating layer. The third electrode includes a first electrode portion. The first semiconductor region includes $Al_{x1}Ga_{1-x1}N$ ($0 \le x1 < 1$). The first semiconductor region includes a first partial region, a second partial region, a third partial region, a fourth partial region and a fifth partial region. The second semiconductor region includes $Al_{x2}Ga_{1-x2}N$ ($x1 < x2 \le 1$). The second semiconductor region includes a first semiconductor portion and a second semiconductor portion. The first layer includes Al and N. The first layer includes a first compound region. The second layer includes Al, Si, O and N. The second layer includes a first intermediate region. The first insulating layer includes Si and O.

18 Claims, 8 Drawing Sheets

(51) Int. Cl.

| | |
|---|---|
| ***H10D 64/27*** | (2025.01) |
| ***H10P 14/20*** | (2026.01) |
| ***H10P 14/692*** | (2026.01) |

(52) U.S. Cl.
CPC .... *H10P 14/3416* (2026.01); *H10P 14/69215* (2026.01); *H10P 14/69391* (2026.01)

(58) Field of Classification Search
CPC ......... H01L 21/02164; H01L 21/02178; H01L 21/0254; H01L 21/3115
See application file for complete search history.

(56) References Cited

U.S. PATENT DOCUMENTS

| | | | | |
|---|---|---|---|---|
| 2014/0124789 | A1* | 5/2014 | Ramdani | H10D 30/015 257/192 |
| 2019/0088770 | A1 | 3/2019 | Tajima et al. | |
| 2020/0027978 | A1* | 1/2020 | Kajiwara | H10D 30/015 |
| 2020/0219987 | A1 | 7/2020 | Lee et al. | |
| 2020/0220003 | A1* | 7/2020 | Kuraguchi | H10D 30/015 |
| 2020/0295169 | A1* | 9/2020 | Kato | H10D 30/015 |
| 2020/0411675 | A1* | 12/2020 | Kato | H10D 30/4732 |

FOREIGN PATENT DOCUMENTS

| | | | |
|---|---|---|---|
| JP | 2019-134164 | A | 8/2019 |
| JP | 2020-150141 | A | 9/2020 |
| JP | 2020-174202 | A | 10/2020 |
| JP | 2021-68722 | A | 4/2021 |
| JP | 2022-517320 | A | 3/2022 |

OTHER PUBLICATIONS

Kenta Watanabe, et al., "$SiO_2$/AlON stacked gate dielectrics for AlGaN/GaN MOS heterojunction field-effect transistors," Japanese Journal of Applied Physics, vol. 57, pp. 06KA03-01 to 06KA03-6 (2018).

Japan Patent Office, Office Action in JP App. No. 2022-126227 (May 13, 2025).

* cited by examiner

SEMICONDUCTOR DEVICE

CROSS-REFERENCE TO RELATED APPLICATIONS

This application is based upon and claims the benefit of priority from Japanese Patent Application No. 2022-126227, filed on Aug. 8, 2022; the entire contents of which are incorporated herein by reference.

FIELD

Embodiments of described herein generally relate to a semiconductor device.

BACKGROUND

For example, in a semiconductor device such as a transistor, stable characteristics are desired.

DETAILED DESCRIPTION

Figure 1:
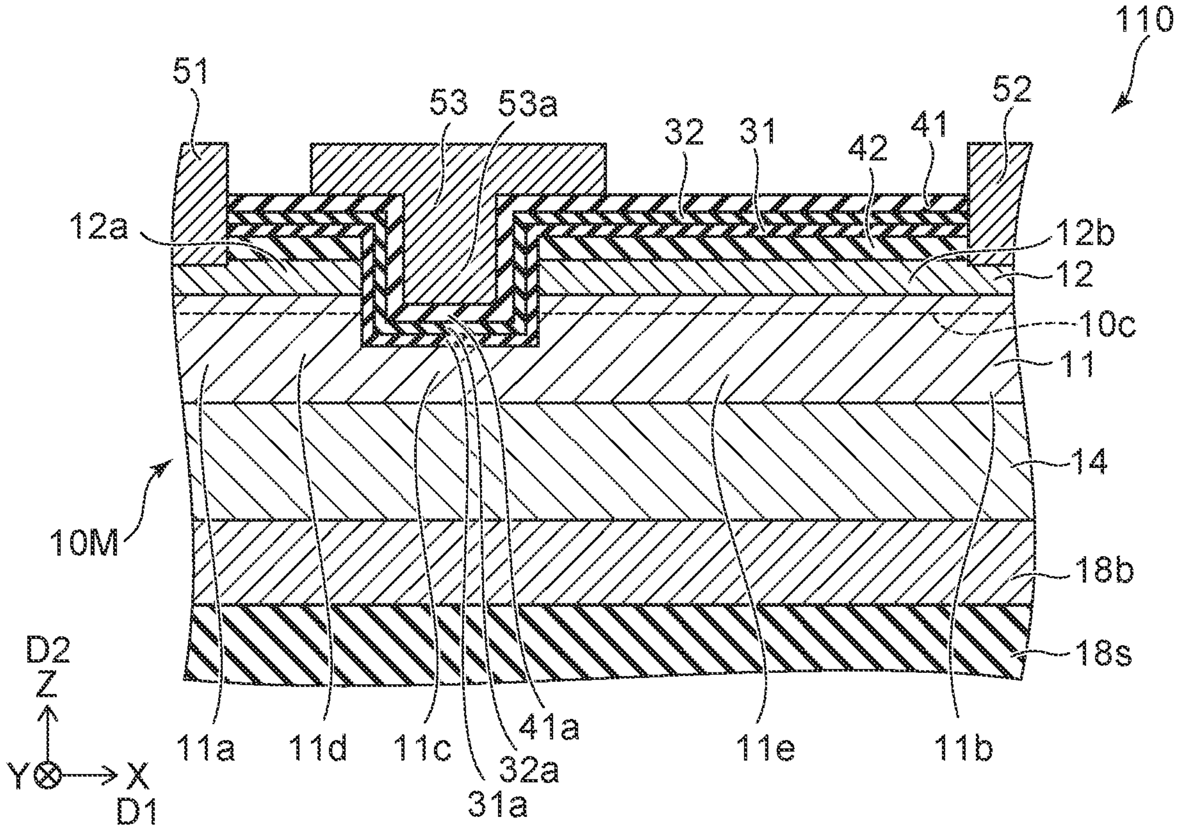
FIG. 1 is a schematic cross-sectional view illustrating a semiconductor device according to a first embodiment.

According to one embodiment, a semiconductor device includes a first electrode, a second electrode, a third electrode, a first semiconductor region, a second semiconductor region, a first layer, a second layer, and a first insulating layer. A direction from the first electrode to the second electrode is along a first direction. The third electrode includes a first electrode portion. A position of the first electrode portion in the first direction is between a position of the first electrode in the first direction and a position of the second electrode in the first direction. The first semiconductor region includes $Al_{x1}Ga_{1-x1}N$ ($0 \leq x1 < 1$). The first semiconductor region includes a first partial region, a second partial region, a third partial region, a fourth partial region and a fifth partial region. A direction from the first partial region to the first electrode is along a second direction crossing the first direction. A direction from the second partial region to the second electrode is along the second direction. A direction from the third partial region to the first electrode portion is along the second direction. A position of the fourth partial region in the first direction is between a position of the first partial region in the first direction and a position of the third partial region in the first direction. A position of the fifth partial region in the first direction is between the position of the third partial region in the first direction and a position of the second partial region in the first direction. The second semiconductor region includes $Al_{x2}Ga_{1-x2}N$ ($x1 < x2 \leq 1$). The second semiconductor region includes a first semiconductor portion and a second semiconductor portion. A direction from the fourth partial region to the first semiconductor portion is along the second direction. A direction from the fifth partial region to the second semiconductor portion is along the second direction. The first layer includes Al and N. The first layer includes a first compound region. The first compound region is provided between the third partial region and the first electrode region in the second direction. The first compound region does not include oxygen, or a concentration of oxygen in the first compound region is lower than a concentration of nitrogen in the first compound region. The first compound region does not include Ga, or a first compound region Ga concentration in the first compound region is lower than a first compound region Al concentration in the first compound region. The first compound region Al concentration is higher than a third partial region Al concentration in the third partial region. At least a part of the first compound region is a crystal. The first compound region includes a first position. The first position is a center of the first compound region in the second direction. The second layer includes Al, Si, O and N. The second layer includes a first intermediate region. The first intermediate region is provided between the first compound region and the first electrode portion in the second direction. A concentration of Si in the first intermediate region is lower than a concentration of Al in the first intermediate region. A concentration of oxygen in the first intermediate region is higher than a concentration of nitrogen in the first intermediate region. The first intermediate region includes a second position. The second position is a center of the first intermediate region in the second direction. A second position Al concentration in the second position is lower than a first position Al concentration in the first position. A first ratio of a second position nitrogen concentration in the second position to a second position oxygen concentration in the second position is not less than 0.1 and not more than 0.2. The first insulating layer includes Si and O. The first insulating layer includes a first insulating region. The first insulating region is provided between the first intermediate region and the first electrode portion in the second direction.

Embodiments of the present invention will now be described with reference to the drawings.

The drawings are schematic or conceptual, and the relationship between the thickness and width of the respective portions, the ratio of the sizes between the portions, and the like are not necessarily the same as the actual ones. Even when the same part is represented, the dimensions and proportions of each other may be represented differently depending on the drawings.

In the specification of the present application and each of the figures, elements similar to those described above with respect to the previously described figures are denoted by the same reference numerals and a detailed description thereof is omitted as appropriate.

First Embodiment

FIG. 1 is a schematic cross-sectional view illustrating a semiconductor device according to the first embodiment.

As shown in FIG. 1, a semiconductor device 110 according to the embodiment includes a first electrode 51, a second electrode 52, a third electrode 53, a first semiconductor region 11, a second semiconductor region 12, a first layer 31, a second layer 32, and a first insulating layer 41.

A direction from the first electrode 51 to the second electrode 52 is along a first direction D1. The first direction D1 is, for example, an X-axis direction. One direction perpendicular to the X direction is defined as a Z-direction. A direction perpendicular to the X-axis direction and the Z-axis direction is defined as a Y-axis direction.

A third electrode 53 includes a first electrode portion 53*a*. A position of the first electrode portion 53*a* in the first direction D1 is between a position of the first electrode 51 in the first direction D1 and a position of the second electrode 52 in the first direction D1. For example, in the first direction D1, the third electrode 53 is located between the first electrode 51 and the second electrode 52.

The first semiconductor region 11 includes $Al_{x1}Ga_{1-x1}N$ ($0 \leq x1 < 1$). In one example, the composition ratio x1 of Al in the first semiconductor region 11 is, for example, not less than 0 and less than 0.1. The first semiconductor region 11 includes, for example, GaN. The first semiconductor region 11 includes a crystal.

The first semiconductor region 11 includes a first partial region 11*a*, a second partial region 11*b*, a third partial region 11*c*, a fourth partial region 11*d*, and a fifth partial region 11*e*. A direction from the first partial region 11*a* to the first electrode 51 is along a second direction D2. The second direction D2 crosses the first direction D1. The second direction D2 is, for example, the Z-axis direction.

A direction from the second partial region 11*b* to the second electrode 52 is along the second direction D2. A direction from the third partial region 11*c* to the third electrode 53 is along the second direction D2. For example, the region overlapping the first electrode 51 in the second direction D2 corresponds to the first partial region 11*a*. For example, the region overlapping the second electrode 52 in the second direction D2 corresponds to the second partial region 11*b*. For example, the region overlapping the third electrode 53 in the second direction D2 corresponds to the third partial region 11*c*.

A position of the fourth partial region 11*d* in the first direction D1 is between a position of the first partial region 11*a* in the first direction D1 and a position of the third partial region 11*c* in the first direction D1. A position of the fifth partial region 11*e* in the first direction D1 is between the position of the third partial region 11*c* in the first direction D1 and a position of the second partial region 11*b* in the first direction D1. The boundaries between these partial regions may be unclear or clear.

The second semiconductor region 12 includes $Al_{x2}Ga_{1-x2}N$ ($x1 < x2 \leq 1$). In one example, the composition ratio x2 of Al in the second semiconductor region 12 is, for example, not less than 0.1 and not more than 0.35. The second semiconductor region 12 includes, for example, AlGaN. The second semiconductor region 12 includes a crystal.

The second semiconductor region 12 includes a first semiconductor portion 12*a* and a second semiconductor portion 12*b*. A direction from the fourth partial region 11*d* to the first semiconductor portion 12*a* is along the second direction D2. A direction from the fifth partial region 11*e* to the second semiconductor portion 12*b* is along the second direction D2.

The first layer 31 includes Al and N. The first layer 31 includes a first compound region 31*a*. The first compound region 31*a* is provided between the third partial region 11*c* and the first electrode portion 53*a* in the second direction D2. At least a part of the first compound region 31*a* is a crystal. At least a part of the first compound region 31*a* may include a single crystal.

The second layer 32 includes Al, Si, O and N. The second layer 32 includes a first intermediate region 32*a*. The first intermediate region 32*a* is provided between the first compound region 31*a* and the first electrode portion 53*a* in the second direction D2.

The first insulating layer 41 includes Si and O. The first insulating layer 41 includes, for example, $SiO_2$. The first insulating layer 41 includes a first insulating region 41*a*. The first insulating region 41*a* is provided between the first intermediate region 32*a* and the first electrode portion 53*a* in the second direction D2.

A current flowing between the first electrode 51 and the second electrode 52 can be controlled by a potential of the third electrode 53. The potential of the third electrode 53 may be, for example, a potential based on the potential of the first electrode 51. The first electrode 51 functions as a source electrode, for example. The second electrode 52 functions as a drain electrode, for example. The third electrode 53 functions as a gate electrode, for example. The semiconductor device 110 is, for example, a transistor. The first insulating region 41*a* function as at least a part of the gate insulating film.

The first semiconductor region 11 includes a portion facing the second semiconductor region 12. A carrier region 10*c* is provided at the facing portion. The carrier region 10*c* is, for example, a two-dimensional electron gas. The semiconductor device 110 is, for example, a HEMT (high electron mobility transistor).

For example, a distance between the first electrode 51 and the first electrode portion 53*a* along the first direction D1 is shorter than a distance between the first electrode portion 53*a* and the second electrode 52 along the first direction D1. The first electrode 51 functions stably as a source electrode. The second electrode 52 functions stably as a drain electrode. For example, the semiconductor device is hardly broken. For example, it is easy to obtain a semiconductor device having small current collapse and stable characteristics.

For example, the first electrode 51, the second electrode 52, and the third electrode 53 may extend in a third direction D3. The third direction D3 crosses a plane including the first direction D1 and the second direction D2. The third direction D3 is, for example, the Y-axis direction.

As shown in FIG. 1, the semiconductor device 110 may further include a nitride layer 14. The nitride layer 14 is, for example, a GaN layer including C (carbon). The first semiconductor region 11, the second semiconductor region 12, and the nitride layer 14 are included in a semiconductor member 10M.

The semiconductor device 110 may further include a base body 18*s* and a buffer layer 18*b*. The base body 18*s* may include, for example, a silicon substrate, a SiC substrate or a GaN substrate, and the like. The buffer layer 18*b* is provided on the base body 18*s*. The buffer layer 18*b* may include Al, Ga and N. The semiconductor member 10M is provided on the buffer layer 18*b*.

Figure 2:
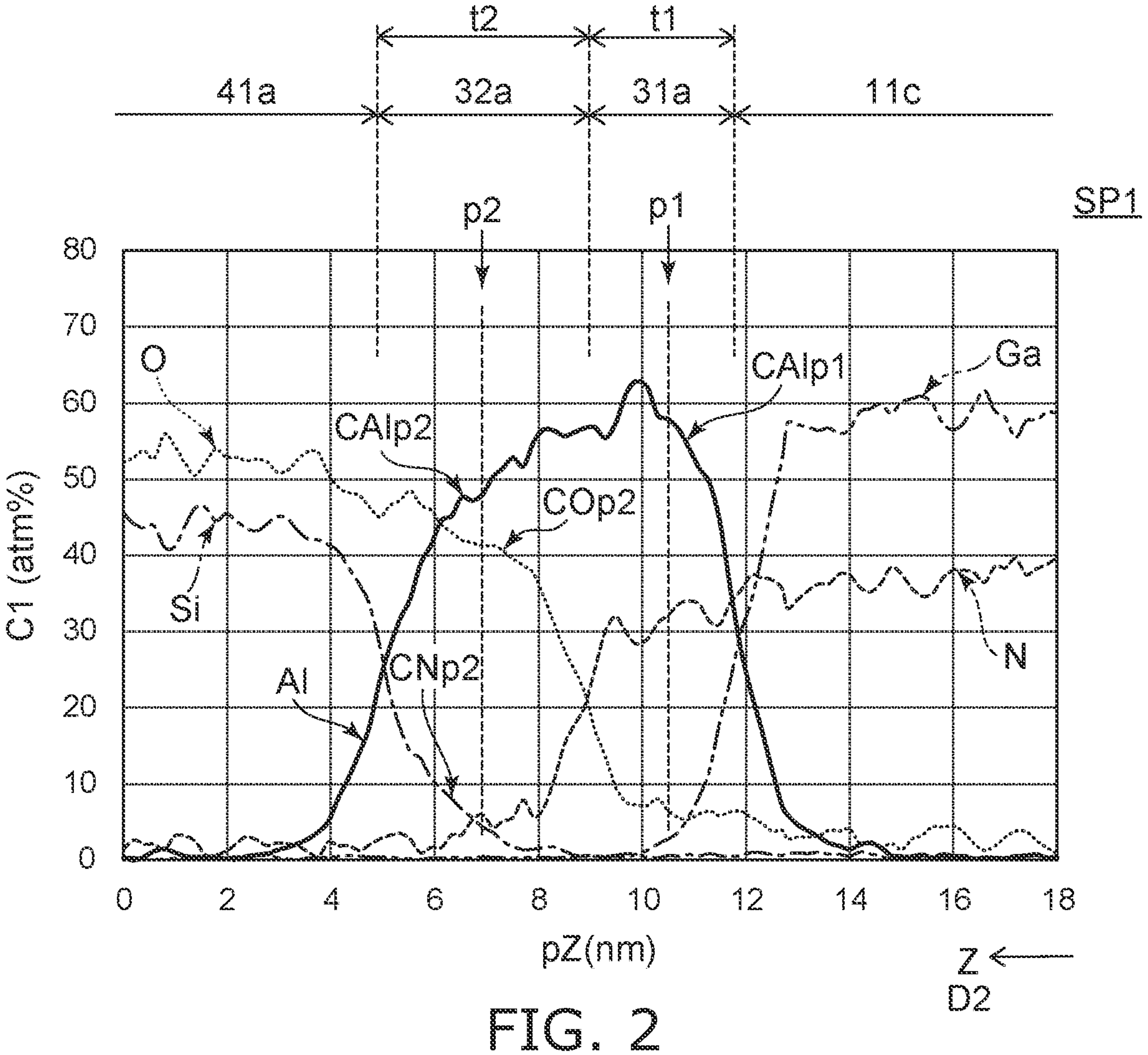
FIG. 2 is a graph illustrating the semiconductor device according to the first embodiment.

FIG. 2 is a graph illustrating the semiconductor device according to the first embodiment.

FIG. 2 illustrates the profile of elements in a first sample SP1, which is one example of the semiconductor device 110. FIG. 2 is an analysis result of a portion including the third partial region 11*c*, the first compound region 31*a*, the first intermediate region 32*a*, and the first insulating region 41*a* by TEM (Transmission Electron Microscope)-EDX (Energy dispersive X-ray spectroscopy). The horizontal axis in FIG. 2 is the position pZ in the Z-axis direction (second direction D2). The vertical axis is concentrations (atomic percent) of the elements. The profiles of Ga, Al, N, O and Si are shown in FIG. 2.

The third partial region 11*c* includes Ga and N.

The first compound region 31*a* does not include Ga. Alternatively, the concentration of Ga in the first compound region 31*a* (the first compound region Ga concentration) is lower than the concentration of Al in the first compound region 31*a* (the first compound region Al concentration). Thereby, high electron mobility is easily obtained. Low on-resistance is easily obtained. The region where the Ga concentration is higher than the Al concentration corresponds to the third partial region 11*c*. The region where the concentration of Al is higher than the concentration of Ga corresponds to the first compound region 31*a*. For example, the position pZ where the concentration of Al is the same as the concentration of Ga may be regarded as the boundary between the third partial region 11*c* and the first compound region 31*a*.

The concentration of Al in the first compound region 31*a* (first compound region Al concentration) is higher than the concentration of Al in the third partial region 11*c* (third partial region Al concentration). The first compound region 31*a* does not include oxygen. Alternatively, the concentration of oxygen in the first compound region 31*a* is lower than the concentration of nitrogen in the first compound region 31*a*. Thereby, the film having high crystallinity is easily obtained.

A concentration of oxygen in the first intermediate region 32*a* is higher than a concentration of nitrogen in the first intermediate region 32*a*. Thereby, for example, a film having few traps is easily obtained. Stable characteristics are easily obtained. The region where the concentration of oxygen is higher than the concentration of nitrogen corresponds to the first intermediate region 32*a*. The region where the concentration of nitrogen is higher than the concentration of oxygen corresponds to the first compound region 31*a*. For example, the position pZ where the concentration of oxygen is the same as the concentration of nitrogen may be regarded as the boundary between the first compound region 31*a* and the first intermediate region 32*a*.

A concentration of Si in the first intermediate region 32*a* is lower than a concentration of Al in the first intermediate region 32*a*.

A concentration of Si in the first insulating region 41*a* is higher than the concentration of Si in the first intermediate region 32*a*. The first insulating region 41*a* does not include Al. Alternatively, the concentration of Al in the first insulating region 41*a* is lower than the concentration of Si in the first insulating region 41*a*. The region where the concentration of Si is higher than the concentration of Al corresponds to the first insulating region 41*a*. The region where the concentration of Al is higher than the concentration of Si corresponds to the first intermediate region 32*a*. The position pZ where the concentration of Si is the same as the concentration of Al may be regarded as the boundary between the first insulating region 41*a* and the first intermediate region 32*a*.

The first compound region 31*a* includes a first position p1. The first position p1 is the center of the first compound region 31*a* in the second direction D2. On the other hand, the first intermediate region 32*a* includes a second position p2. The second position p2 is the center of the first intermediate region 32*a* in the second direction D2. The concentration of Al at the second position p2 (second position Al concentration CAlp2) is lower than the concentration of Al at the first position p1 (first position Al concentration CAlp1).

The concentration of Al in the first compound region 31*a* is higher than the concentration in the first intermediate region 32*a*. As a result, a low on-resistance can be obtained. For example, by providing the first compound region 31*a*, for example, a strong piezoelectric charge is generated in the third partial region 11*c* as compared with the case where the first compound region 31*a* is not provided. Thereby, a steep electron potential well is formed. For example, scattering of electrons is suppressed. For example, high electron mobility can be obtained in the third partial region 11*c*.

For example, the higher the concentration of Al in the first compound region 31*a*, the stronger piezoelectric charge is likely to be generated, and the steeper electron potential well is likely to be formed in the third partial region 11*c*. Higher electron mobility is easily obtained in the third partial region 11*c*. For example, the higher the crystallinity of the first compound region 31*a*, the stronger the piezoelectric charge is likely to be generated, and the steeper electron potential well is likely to be formed in the third partial region 11*c*. Higher electron mobility is easily obtained in the third partial region 11*c*.

For example, the higher the concentration of Al in the first compound region 31*a*, the easier it is to obtain high electron mobility in the third partial region 11*c*, even if the thickness of the first compound region 31*a* is thin. For the formation of the first compound region 31*a*, an atomic layer deposition (ALD) method having good coverage may be used. By the Al concentration in the first compound region 31*a* being high, the thickness of the first compound region 31*a* can be reduced. The process time can be shortened.

For example, the Al concentration at the first position p1 is preferably 5 times or more the Ga concentration at the first position p1. Thereby, for example, a high electron mobility is easily obtained. The thickness of the first compound region 31*a* can be reduced. The process time can be shortened.

The concentration of nitrogen at the second position p2 is defined as the second position nitrogen concentration CNp2. The oxygen concentration at the second position p2 is defined as the second position oxygen concentration COp2. The ratio of the second position nitrogen concentration CNp2 to the second position oxygen concentration COp2 (CNp2/COp2) is defined as the first ratio. In the embodiment, the first ratio is not less than 0.1 and not more than 0.2. As a result, it was found that stable characteristics is obtained.

Experimental results performed by the inventors of the present application will be described below. In the experiment, samples in which the formation condition of the second layer 32 is changed are prepared. In this example, the AlN film and the $Al_2O_3$ film are alternately and repeatedly formed and heat-treated. As a result, interdiffusion occurs between the AlN film and the $Al_2O_3$ film, and the second layer 32 is obtained. The first ratio is changed by changing the thickness of the AlN film and the thickness of the $Al_2O_3$ film in the repeated stacking. For example, when the thickness of the AlN film is made relatively thin with respect to the thickness of the $Al_2O_3$ film, the first ratio (concentration of nitrogen) becomes low. For example, when the thickness of the AlN film is made relatively thick with respect to the thickness of the $Al_2O_3$ film, the first ratio (concentration of nitrogen) is increased. For these samples, a change in the threshold voltage is measured in an acceleration test in which a voltage is applied to the gate electrode.

Figure 3A:
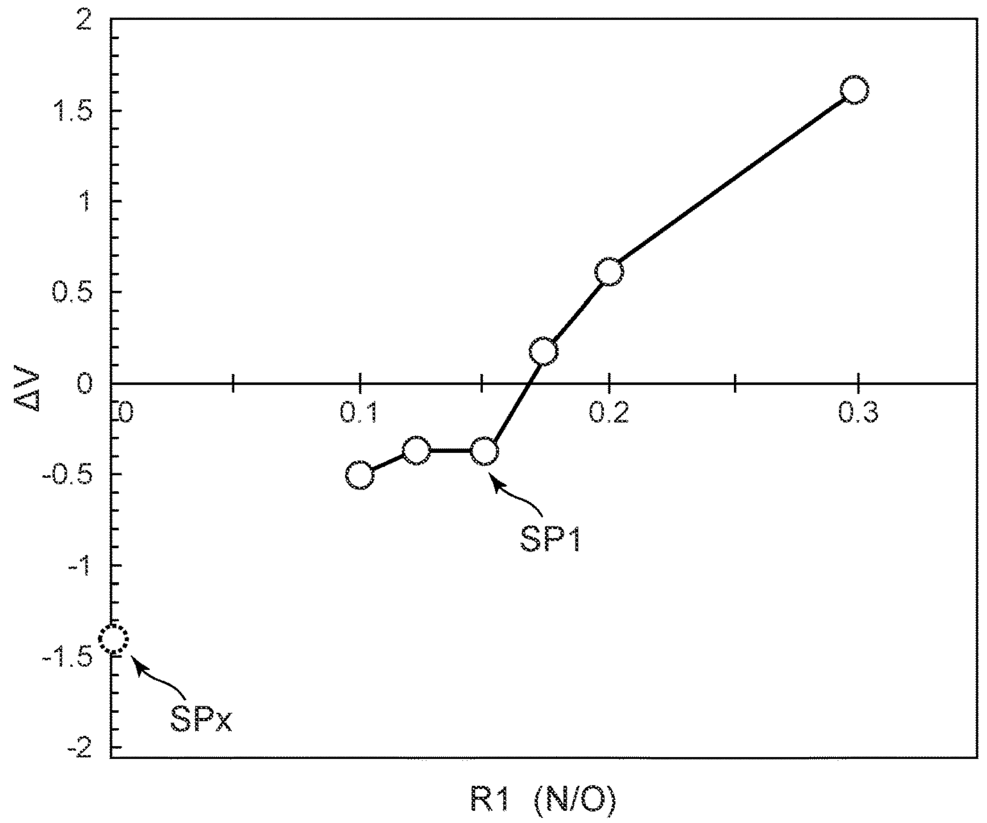
FIG. 3A and FIG. 3B are graphs illustrating experimental results.
Figure 3B:
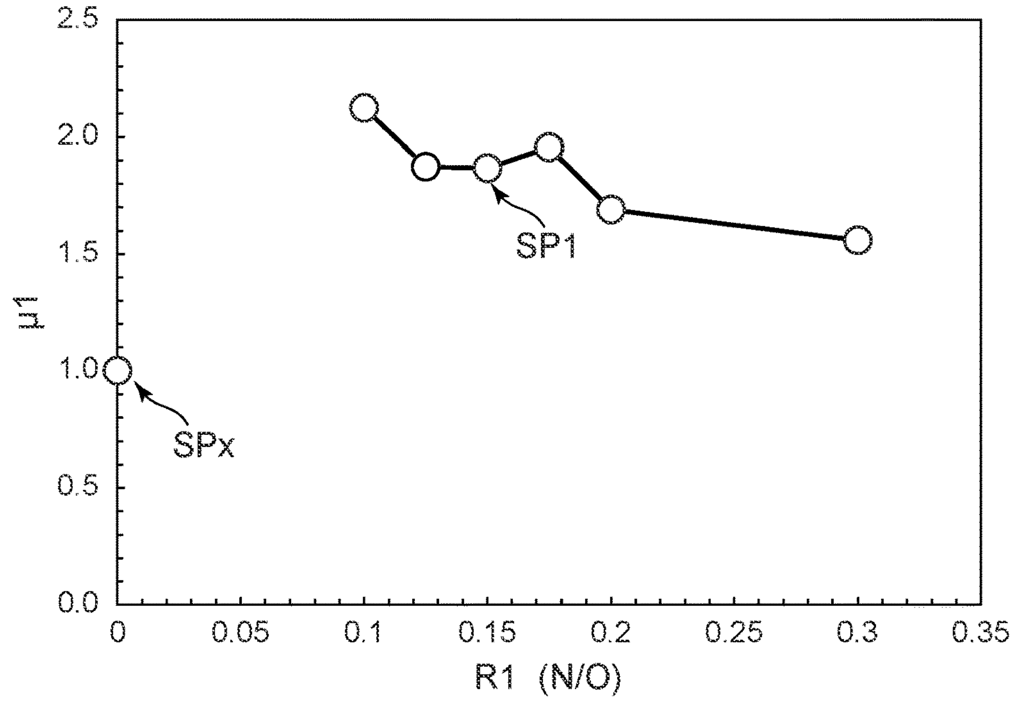

FIG. 3A and FIG. 3B are graphs illustrating experimental results.

The horizontal axis of FIG. 3A is the first ratio R1. The vertical axis of FIG. 3A is a change ΔV of the threshold voltage. In FIG. 3A, the change ΔV in a reference sample SPx in which the second layer 32 (the first intermediate region 32*a*) is not provided is shown by a broken line. FIG. 3A shows the change ΔV in other samples in which the formation conditions of the second layer 32 are changed in addition to the first sample SP1.

As shown in FIG. 3A, in the reference sample $SP_x$, the absolute value of the change ΔV is large. In the other samples including the first sample SP1, when the first ratio R1 is changed, the absolute value of the change ΔV changes. As can be seen from FIG. 3A, when the first ratio R1 is not less than 0.1 and not more than 0.2, the absolute value of the change ΔV is small. When the first ratio R1 is not less than 0.125 and not more than 0.175, the absolute value of especially small change ΔV is obtained. For example, when the first ratio R1 is less than 0.1, the absolute value of the change ΔV is large. For example, when the first ratio R1 is 0.05, the change ΔV becomes about −1.

When the first ratio R1 is not less than 0.1 and not more than 0.2, for example, it is considered that the generation of traps is suppressed in the first intermediate region 32*a*. For example, it is considered that the generation of traps is suppressed at the interface between the first intermediate region 32*a* and the first insulating region 41*a*. For example, it is considered that the generation of traps is suppressed at the interface between the first intermediate region 32*a* and the first compound region 31*a*. It is considered that the absolute value of the change ΔV of the threshold voltage can be reduced by suppressing the generation of traps.

The horizontal axis of FIG. 3B shows the first ratio R1. The vertical axis in FIG. 3B is the electron mobility μ1. The electron mobility μ1 is standardized by taking the electron mobility of the reference sample SPx in which the second layer 32 (the first intermediate region 32*a*) is not provided as 1. It is preferable that the electron mobility μ1 is high.

As can be seen from FIG. 3B, in the other samples including the first sample SP1, the electron mobility μ1 higher than that of the reference sample SPx is obtained. As can be seen from FIG. 3B, when the first ratio R1 is not less than 0.1 and not more than 0.2, especially high electron mobility μ1 is obtained. When the first ratio R1 is 0.1 to 0.175, a higher electron mobility μ1 is obtained. For example, when the first ratio R1 is less than 0.1, the electron mobility μ1 is low. For example, when the first ratio R1 is 0.05, the electron mobility μ1 is about 1.7.

In the case where the first intermediate region 32*a* is provided, the electron mobility μ1 in the third partial region 11*c* becomes high compared with that in the case where the first intermediate region 32*a* is not provided. For example, when the first ratio R1 is 0.15, the electron mobility μ1 in the third partial region 11*c* becomes about 1.9 times that in the case where the first intermediate region 32*a* is not provided.

By providing the first intermediate region 32*a*, the interface with the first compound region 31*a* is improved. For example, the first compound region 31*a* having higher crystallinity can be obtained. In the first compound region 31*a* having higher crystallinity, there are fewer polycrystalline layers and fewer amorphous layers. Thereby, a steep electron potential well is easily formed in the third partial region 11*c*. As a result, it is considered that a higher electron mobility μ1 is easily obtained in the third partial region 11*c*. Especially high mobility is obtained when the first ratio R1 is not less than 0.1 and not more than 0.2. A semiconductor device having a low on-resistance can be obtained. Especially high electron mobility is obtained when the first ratio R1 is not less than 0.1 and not more than 0.175. A semiconductor device having a lower on-resistance can be obtained.

In the embodiment, the first ratio R1 is preferably not less than 0.1 and not more than 0.2. The absolute value of the small change ΔV is obtained. High electron mobility μ1 is obtained. The first ratio R1 may be not less than 0.125 and not more than 0.175. A smaller absolute value of the change ΔV is obtained. High electron mobility μ1 is obtained. According to the embodiment, a semiconductor device capable of obtaining stable characteristics can be provided.

In the embodiment, at least a part of the first intermediate region 32*a* is preferably amorphous. Thereby, for example, leakage current can be suppressed. In the embodiment, at least a part of the first insulating region 41*a* is preferably amorphous. Thereby, for example, leakage current can be suppressed.

On the other hand, it is preferable that the first compound region 31*a* includes a crystal. Thereby, for example, a low on-resistance can easily be obtained.

The thickness of the first compound region 31*a* along the second direction D2 is defined as a first thickness t1 (see FIG. 2). In the embodiment, the first thickness t1 is preferably not less than 1 nm and not more than 10 nm. By the first thickness t1 being 1 nm or more, high electron mobility μ1 is easily obtained. By the first thickness t1 being 10 nm or less, for example, crystal with few cracks is easily obtained. For example, gate leakage current caused by the crack can be reduced. By the first thickness t1 being 10 nm or less, for example, the Al concentration in the first compound region 31*a* can be increased. Thereby, a high electron mobility is easily obtained. The first thickness t1 is more preferably not less than 1.5 nm and not more than 5 nm. A high electron mobility μ1 and a film having a low leakage current is obtained.

The thickness of the first intermediate region 32*a* along the second direction D2 is defined as a second thickness t2 (see FIG. 2). In the embodiment, the second thickness t2 is preferably not less than 0.5 nm and not more than 7 nm. A semiconductor device having stable characteristics is obtained. The second thickness t2 is more preferably not less than 1 nm and not more than 3 nm. Thereby, it becomes easy to obtain stable characteristics with small changes in the threshold voltage.

As shown in FIG. 1, in this example, at least a part of the first electrode portion 53*a* is located between the fourth partial region 11*d* and the fifth partial region 11*e* in the first direction D1. The third electrode 53 is, for example, a recessed gate electrode. For example, a normally-off operation is obtained.

In normally-off operation, it is particularly desirable that the threshold voltage be stable. By providing the first compound region 31*a* and the first intermediate region 32*a*, the normally-off operation in which the change ΔV of the threshold voltage is suppressed is obtained.

Figure 4:
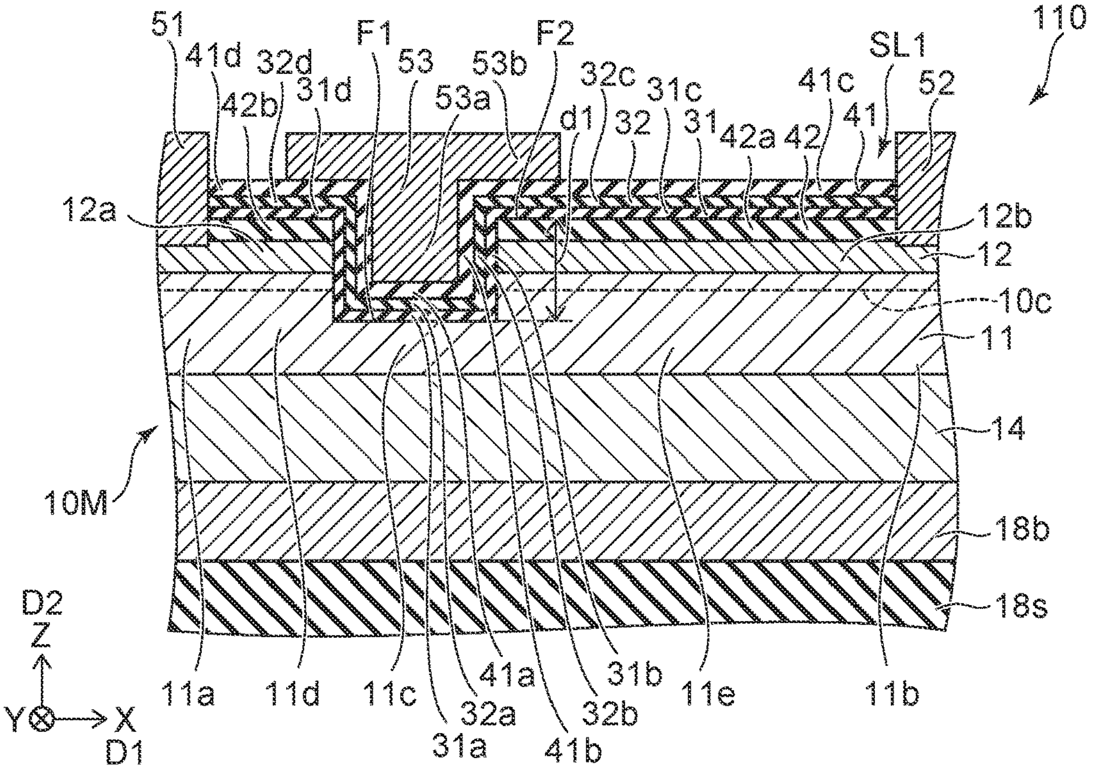
FIG. 4 is a schematic cross-sectional view illustrating the semiconductor device according to the first embodiment.

FIG. 4 is a schematic cross-sectional view illustrating the semiconductor device according to the first embodiment.

As shown in FIG. 4, in the semiconductor device 110 according to the embodiment, the first layer 31 may further include a second compound region 31*b*. The second layer 32 may further include a second intermediate region 32*b*. The first insulating layer 41 may further include a second insulating region 41*b*.

The second insulating region 41*b* is located between the first electrode portion 53*a* and the second semiconductor portion 12*b* in the first direction D1. The second intermediate region 32*b* is located between the second insulating region 41*b* and the second semiconductor portion 12*b* in the first direction D1. The second compound region 31*b* is located between the second intermediate region 32*b* and the second semiconductor portion 12*b* in the first direction D1. For example, the second compound region 31*b* may be a single crystal. For example, a stable normally-off operation is obtained.

Thus, the stacked film SL1 including the first layer 31, the second layer 32 and the first insulating layer 41 may be provided between the first electrode portion 53*a* and the second semiconductor portion 12*b*. The stacked film SL1 may be provided between the first semiconductor portion 12*a* and the first electrode portion 53*a*.

As shown in FIG. 4, the first layer 31 may further include a third compound region 31*c*. The second layer 32 may further include a third intermediate region 32*c*. The first insulating layer 41 may further include a third insulating region 41*c*. The third compound region 31*c* may be amorphous. Leak current is easily suppressed.

The second semiconductor portion 12*b* is located between the fifth partial region 11*e* and the third insulating region 41*c* in the second direction D2. The third compound region 31*c* is located between the second semiconductor portion 12*b* and the third insulating region 41*c* in the second direction D2. The third intermediate region 32*c* is located between the third compound region 31*c* and the third insulating region 41*c* in the second direction D2.

Thus, the stacked film SL1 may be provided in at least a part of the region between the third electrode 53 and the second electrode 52.

The first layer 31 may further include a fourth compound region 31*d*. The second layer 32 may further include a fourth intermediate region 32*d*. The first insulating layer 41 may further include a fourth insulating region 41*d*.

The first semiconductor portion 12*a* is located between the fourth partial region 11*d* and the fourth insulating region 41*d* in the second direction D2. The fourth compound region 31*d* is located between the first semiconductor portion 12*a* and the fourth insulating region 41*d* in the second direction D2. The fourth intermediate region 32*d* is located between the fourth compound region 31*d* and the fourth insulating region 41*d* in the second direction D2.

Thus, the stacked film SL1 may be provided in at least a part of the region between the first electrode 51 and the third electrode 53.

As shown in FIG. 4, the semiconductor device 110 may further include a second insulating layer 42. The second insulating layer 42 includes at least one selected from the group consisting of oxygen and nitrogen and at least one selected from the group consisting of Si and Al. In one example, the second insulating layer 42 includes, for example, SiN. In one example, the second insulating layer 42 includes, for example, AlN. The second insulating layer 42 includes, for example, an amorphous region.

The second insulating layer 42 includes a first insulating portion 42*a*. The first insulating portion 42*a* is located between the second semiconductor portion 12*b* and the third compound region 31*c*. By providing the second insulating layer 42, the semiconductor member 10M is protected. For example, stable characteristics are easily obtained. Leak current is easily suppressed. Current collapse is easily suppressed.

The second insulating layer 42 may include a second insulating portion 42*b*. The second insulating portion 42*b* is located between the first semiconductor portion 12*a* and the fourth compound region 31*d*.

As shown in FIG. 4, the first compound region 31*a* includes a first face F1. The first face F1 faces the third partial region 11*c*. The third compound region 31*c* includes a second face F2. The second face F2 faces the first insulating portion 42*a*. The distance along the second direction D2 between the position of the first face F1 in the second direction D2 and the position of the second face F2 in the second direction D2 is defined as a first distance d1. In the embodiment, the first distance d1 is preferably not less than 100 nm and not more than 400 nm. An appropriate threshold voltage is easily obtained. The first distance d1 corresponds, for example, to the depth of the recess.

The position of the first face F1 in the second direction D2 is preferably between the position of the second semiconductor region 12 in the second direction D2 and the position of the nitride layer 14 in the second direction D2. For example, a high electron mobility is easily obtained. Stable characteristics are easily obtained. Threshold voltage fluctuation is easily suppressed.

As shown in FIG. 4, the third electrode 53 may further include a second electrode portion 53*b*. The position of the second electrode portion 53*b* in the first direction D1 is between the position of the first electrode portion 53*a* in the first direction D1 and the position of the second electrode 52 in the first direction D1. The second electrode portion 53*b* is continuous with the first electrode portion 53*a*. A part of the second semiconductor portion 12*b* is provided between the fifth partial region 11*e* and the second electrode portion 53*b* in the second direction D2. A part of the third compound region 31*c*, a part of the third intermediate region 32*c*, and a part of the third insulating region 41*c* are located between the first insulating portion 42*a* and the second electrode portion 53*b* in the second direction D2.

High electric field tends to occur at the end of the second electrode portion 53*b*. This may cause destruction. By providing the first insulating portion 42*a* below the second electrode portion 53*b*, the electric field is relaxed. For example, a higher breakdown voltage is obtained. The destruction and the like is suppressed. By providing the stacked film SL1 below the second electrode portion 53*b*, a higher breakdown voltage can be obtained.

Figure 5:
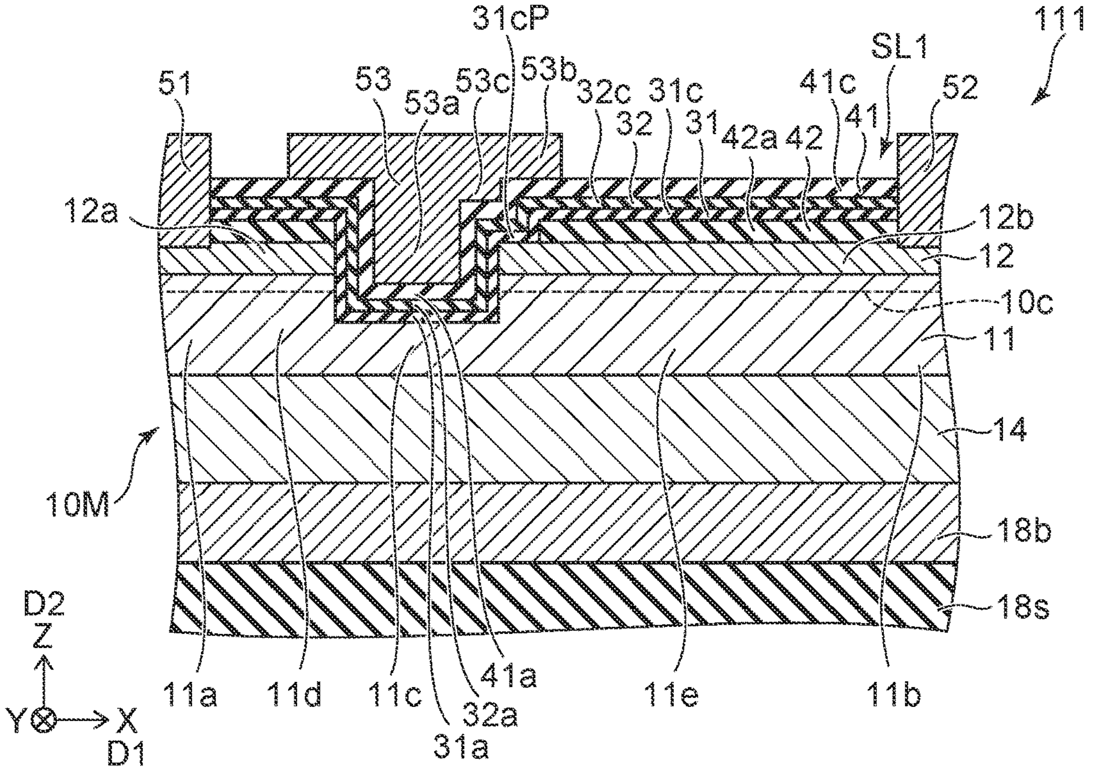
FIG. 5 is a schematic cross-sectional view illustrating a semiconductor device according to the first embodiment.

FIG. 5 is a schematic cross-sectional view illustrating a semiconductor device according to the first embodiment.

As shown in FIG. 5, in a semiconductor device 111 according to the embodiment, the structure of the portion below the second electrode portion 53*b* is different from the structure in the semiconductor device 110. Except for this, the configuration of the semiconductor device 111 may be the same as the configuration of the semiconductor device 110.

In the semiconductor device 111, the third electrode 53 includes the first electrode portion 53*a*, the second electrode portion 53*b*, and a third electrode portion 53*c*. As described above, the position of the second electrode portion 53*b* in the first direction D1 is between the position of the first electrode portion 53*a* in the first direction D1 and the position of the second electrode 52 in the first direction D1. The second electrode portion 53*b* is continuous with the first electrode portion 53*a*.

The third electrode portion 53*c* is located between the first electrode portion 53*a* and the second electrode portion 53*b*. The third electrode portion 53*c* is continuous with the first electrode portion 53*a* and the second electrode portion 53*b*.

A part of the second semiconductor portion 12*b* is provided between the fifth partial region 11*e* and the third electrode portion 53*c* in the second direction D2. A part of the second semiconductor portion 12*b* is also provided between the fifth partial region 11*e* and the second electrode portion 53*b* in the second direction D2.

As shown in FIG. 5, in the semiconductor device 111, another portion 31*c*P of the third compound region 31*c* is located between the first electrode portion 53*a* and the first insulating portion 42*a* in the first direction D1. For example, the other portion 31*c*P of the third compound region 31*c* contacts the second semiconductor portion 12*b*.

In the example of the semiconductor device 111, the first insulating portion 42*a* is provided below the second electrode portion 53*b* (end portion of the third electrode 53). The first insulating portion 42*a* is omitted below the portion between the first electrode portion 53*a* and the second electrode portion 53*b* (the third electrode portion 53*c*). By providing the first insulating portion 42*a* below the second electrode portion 53*b*, concentration of the electric field can be suppressed as described above. High breakdown voltage is obtained. By omitting the first insulating portion 42*a* below the third electrode portion 53*c*, a high carrier concentration can be obtained, for example, in the carrier region 10*c* below the other portion 31*c*P of the third compound region 31*c*. For example, low on-resistance is easily obtained.

Figure 6:
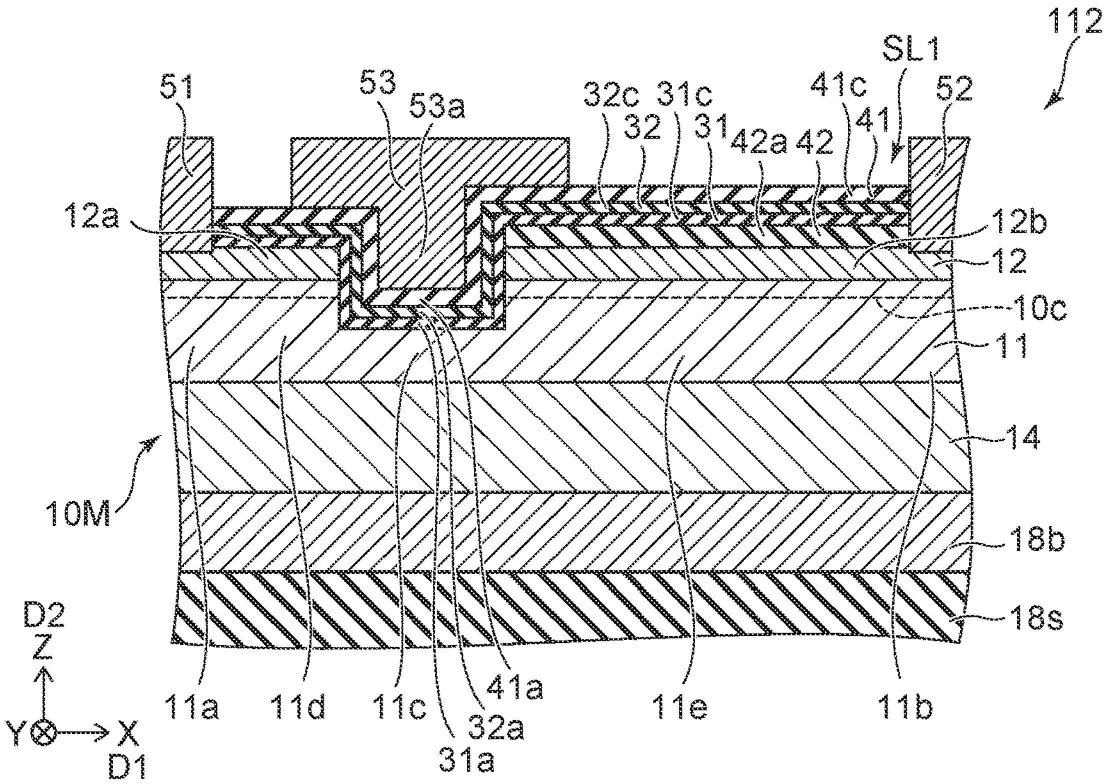
FIG. 6 is a schematic cross-sectional view illustrating a semiconductor device according to the first embodiment.

FIG. 6 is a schematic cross-sectional view illustrating a semiconductor device according to the first embodiment.

As shown in FIG. 6, in a semiconductor device 112 according to the embodiment, the second insulating portion 42*b* is omitted. Except for this, the configuration of the semiconductor device 112 may be the same as the configuration of the semiconductor device 110. In the semiconductor device 112, a high carrier concentration is obtained in a carrier region between the first electrode 51 and the third electrode 53. Low on-resistance is easily obtained.

Figure 7:
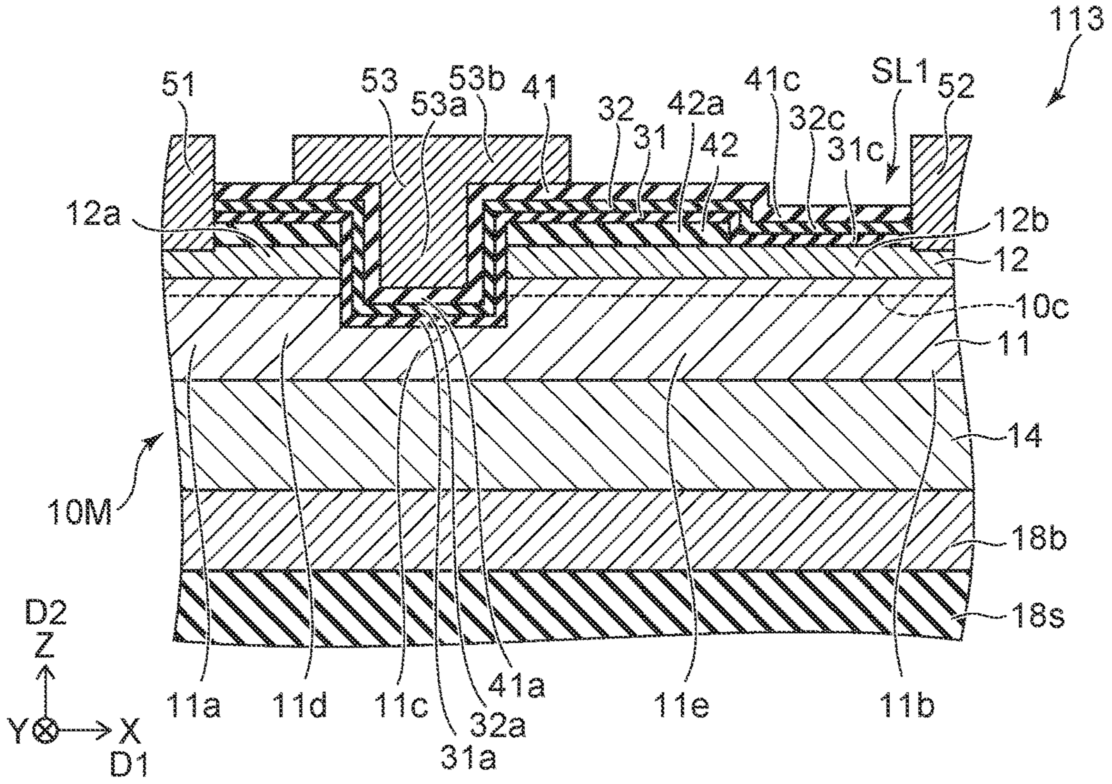
FIG. 7 is a schematic cross-sectional view illustrating a semiconductor device according to the first embodiment.

FIG. 7 is a schematic cross-sectional view illustrating a semiconductor device according to the first embodiment.

As shown in FIG. 7, in a semiconductor device 113 according to the embodiment, the first insulating portion 42*a* is omitted in the vicinity of the second electrode 52. Except for this, the configuration of the semiconductor device 113 may be the same as the configuration of the semiconductor device 110.

In the semiconductor device 113, a part of the third compound region 31*c* is located between the first insulating portion 42*a* and the second electrode 52 in the first direction D1. For example, a part of the third compound region 31*c* contacts the second semiconductor portion 12*b*. In the semiconductor device 113, a high carrier concentration is obtained in the carrier region 10*c* corresponding to the region where the third compound region 31*c* and the second semiconductor portion 12*b* come into contact. Low on-resistance is easily obtained. Current collapse is unlikely to occur. Stable characteristics are easily obtained.

Figure 8:
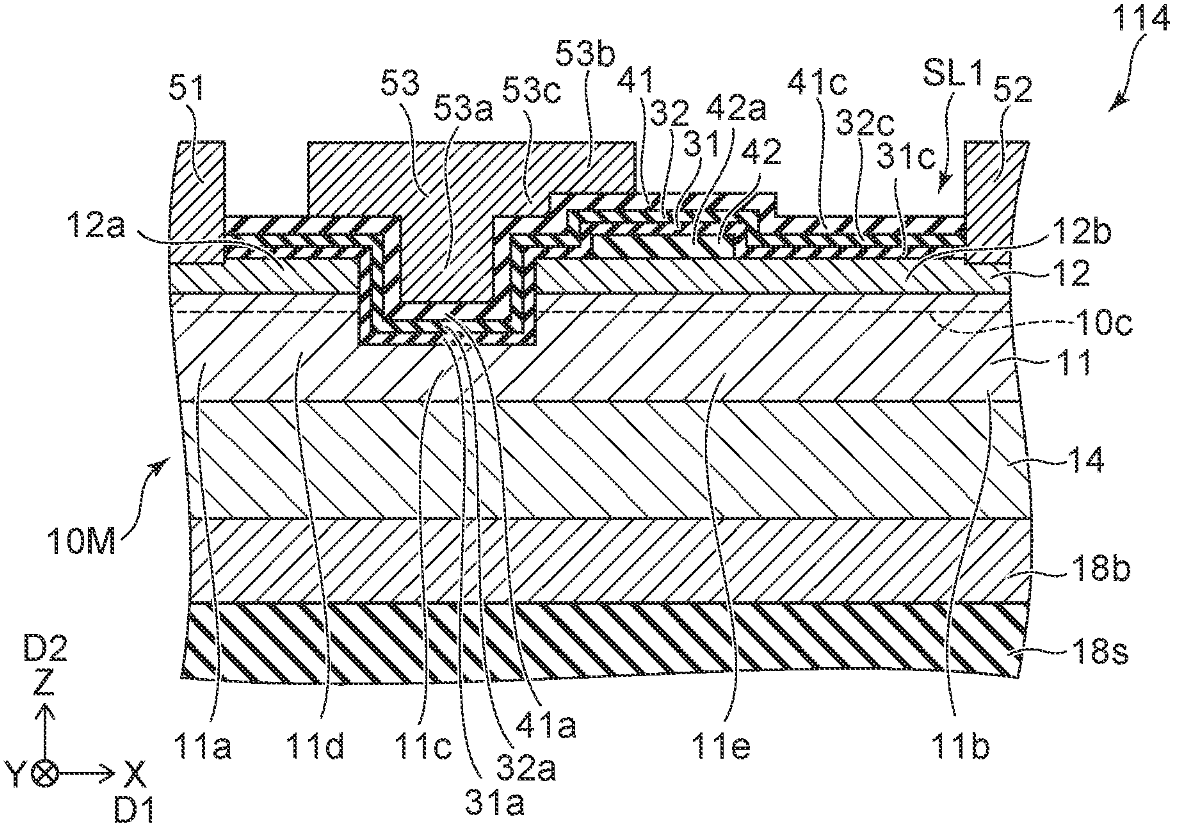
FIG. 8 is a schematic cross-sectional view illustrating a semiconductor device according to the first embodiment.

FIG. 8 is a schematic cross-sectional view illustrating a semiconductor device according to the first embodiment.

As shown in FIG. 8, in a semiconductor device 114 according to the embodiment, the configuration described with respect to the semiconductor device 111, the semiconductor device 112, and the semiconductor device 113 is applied.

In the semiconductor devices 110 to 114, the first ratio is set to not less than 0.1 and not more than 0.2. For example, the change ΔV of the threshold voltage can be suppressed. A semiconductor device capable of obtaining stable characteristics can be provided.

Second Embodiment

Figure 9:
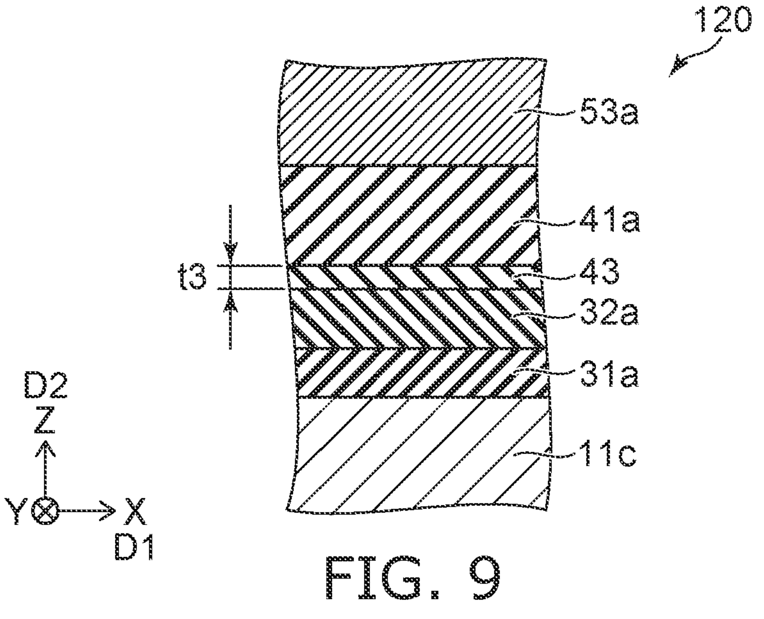
FIG. 9 is a schematic cross-sectional view illustrating a semiconductor device according to a second embodiment.

FIG. 9 is a schematic cross-sectional view illustrating a semiconductor device according to the second embodiment.

FIG. 9 illustrates a part of the semiconductor device 120 according to the embodiment. FIG. 9 illustrates a portion including the third partial region 11*c*, the first compound region 31*a*, the first intermediate region 32*a*, the first insulating region 41*a*, and the first electrode portion 53*a*. The semiconductor device 120 includes a third layer 43. Except for this, the configuration of the semiconductor device 120 may be the same as the configuration of any semiconductor device according to the first embodiment.

At least a part of the third layer 43 is located between the first intermediate region 32*a* and the first insulating region 41*a*. The third layer 43 includes SiN or SiON. A third thickness t3 along the second direction D2 of the at least the part of the third layer 43 is not less than 0.1 nm and not more than 2 nm. By providing the third layer 43, it is possible to suppress diffusion of impurities generated from the third partial region 11*c*, the first compound region 31*a*, and the first intermediate region 32*a* into the first insulating region 41*a*, for example, in a manufacturing step (particularly a heat treatment step). The impurities in the first insulating region 41*a* can be reduced. The diffusion of at least one of Al or Ga into the first insulating region 41*a* can be reduced. Good gate reliability is easily obtained. The gate destruction is less likely to occur. Stable characteristics are easily obtained.

An example of a method of manufacturing the semiconductor device according to the embodiment will be described below.

FIGS. 10A to 10D and FIGS. 11A to 11C are schematic cross-sectional views illustrating a method of manufacturing the semiconductor device according to the embodiment.

Figure 10A:
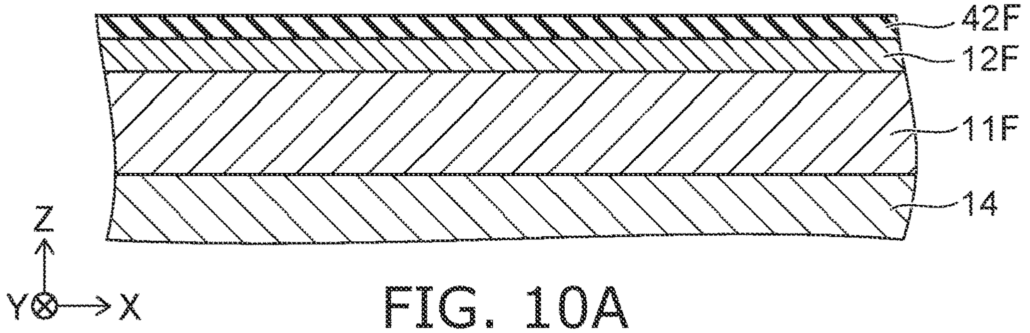
FIGS. 10A to 10D are schematic cross-sectional views illustrating a method of manufacturing a semiconductor device according to an embodiment.

As shown in FIG. 10A, a first semiconductor film 11F is provided on the nitride layer 14. A second semiconductor film 12F is provided on the first semiconductor film 11F. A second insulating film 42F is provided on the second semiconductor film 12F. The first semiconductor film 11F becomes the first semiconductor region 11. The second semiconductor film 12F becomes the second semiconductor region 12. The second insulating film 42F becomes the second insulating layer 42.

Figure 10B:
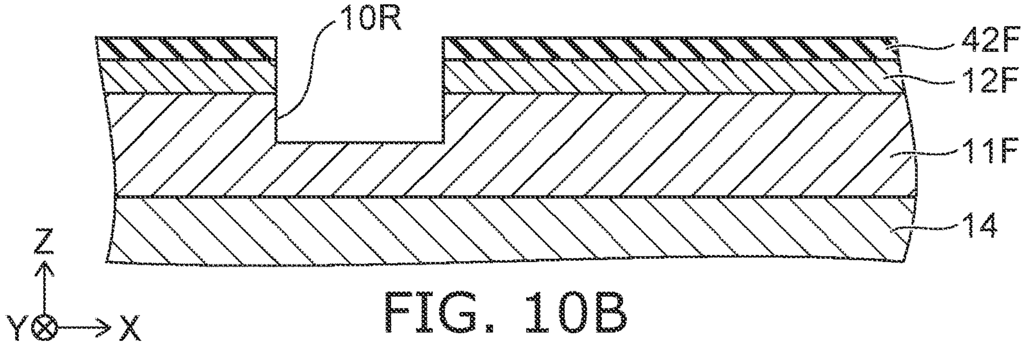

As shown in FIG. 10B, a part of the first semiconductor film 11F, a part of the second semiconductor film 12F, and a part of the second insulating film 42F are removed. Thereby, the trench 10R is formed. The first semiconductor region 11, the second semiconductor region 12, and the second insulating layer 42 are obtained.

Figure 10C:
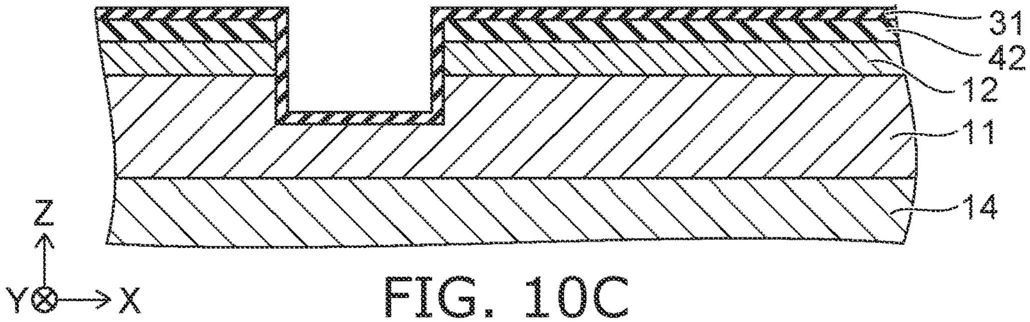

As shown in FIG. 10C, the first layer 31 is formed.

Figure 10D:
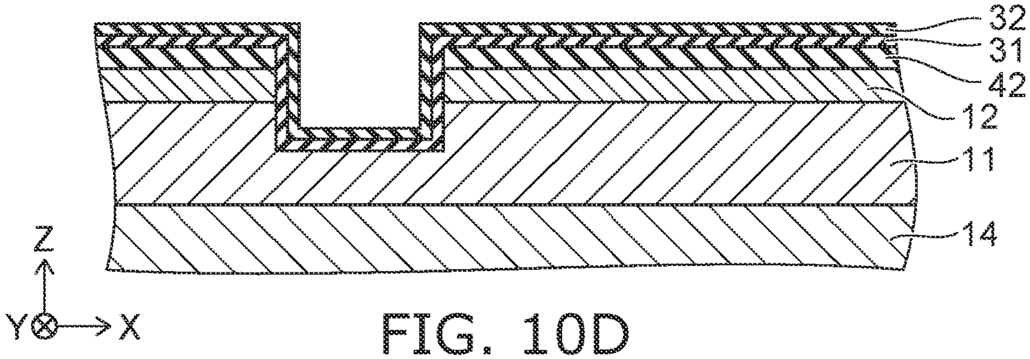

As shown in FIG. 10D, the second layer 32 is formed. For example, a part of the first layer 31 may be oxidized to form the second layer 32.

Figure 11A:
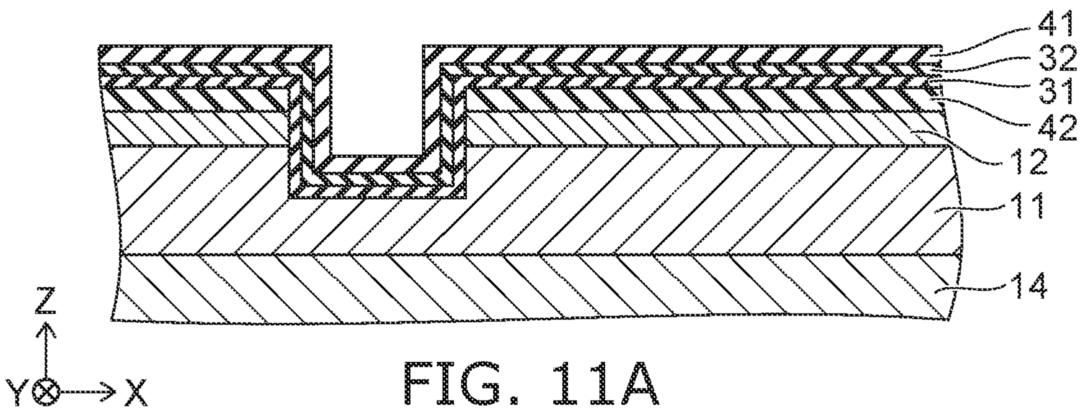
FIGS. 11A to 11C are schematic cross-sectional views illustrating a method of manufacturing a semiconductor device according to an embodiment.

As shown in FIG. 11A, the first insulating layer 41 is formed.

Figure 11B:
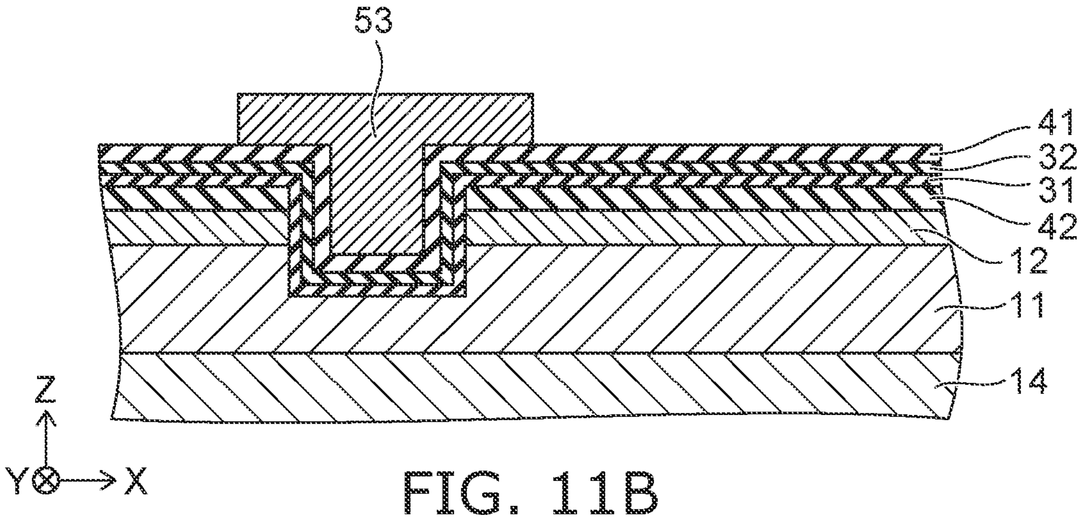

As shown in FIG. 11B, the conductive member is buried in the remaining space of the trench 10R. Thereby, the third electrode 53 is obtained.

Figure 11C:
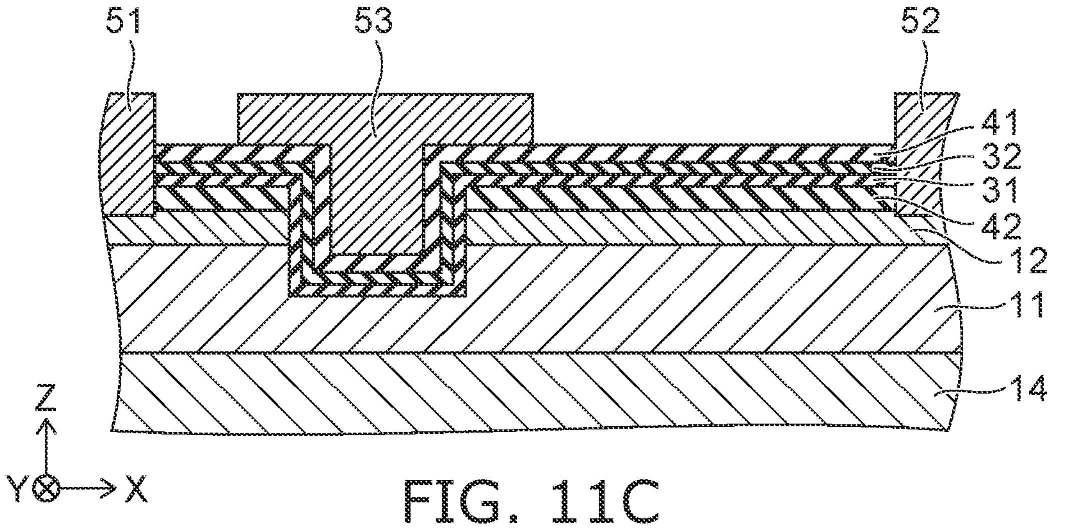

As shown in FIG. 11C, the first electrode 51 and the second electrode 52 are formed. Thereby, for example, the semiconductor device 110 is formed.

In an embodiment, at least one of the first electrode 51 or the second electrode 52 includes at least one selected from the group consisting of, for example, Al and Ti. The third electrode 53 may include, for example, at least one selected from the group consisting of TiN, polysilicon, poly-AlGaN, and poly-GaN.

In embodiments, information about length and thickness can be obtained by electron microscopy and the like. Information about the composition of the material can be obtained by SIMS (Secondary Ion Mass Spectrometry) or EDX (Energy dispersive X-ray spectroscopy).

Embodiments may include the following configurations (e.g., technical proposals).

Configuration 1

A semiconductor device, comprising:

a first electrode;

a second electrode, a direction from the first electrode to the second electrode being along a first direction;

a third electrode, the third electrode including a first electrode portion, a position of the first electrode portion in the first direction being between a position of the first electrode in the first direction and a position of the second electrode in the first direction;

a first semiconductor region including $Al_{x1}Ga_{1-x1}N$ ($0 \leq x1 < 1$), the first semiconductor region including a first partial region, a second partial region, a third partial region, a fourth partial region and a fifth partial region, a direction from the first partial region to the first electrode being along a second direction crossing the first direction, a direction from the second partial region to the second electrode being along the second direction, a direction from the third partial region to the first electrode portion being along the second direction, a position of the fourth partial region in the first direction being between a position of the first partial region in the first direction and a position of the third partial region in the first direction, a position of the fifth partial region in the first direction being between the position of the third partial region in the first direction and a position of the second partial region in the first direction;

a second semiconductor region including $Al_{x2}Ga_{1-x2}N$ ($x1 < x2 \leq 1$), the second semiconductor region including a first semiconductor portion and a second semiconductor portion, a direction from the fourth partial region to the first semiconductor portion being along the second direction, a direction from the fifth partial region to the second semiconductor portion being along the second direction;

a first layer including Al and N, the first layer including a first compound region, the first compound region being provided between the third partial region and the first electrode region in the second direction, the first compound region not including oxygen, or a concentration of oxygen in the first compound region being lower than a concentration of nitrogen in the first compound region, the first compound region not including Ga, or a first compound region Ga concentration in the first compound region being lower than a first compound region Al concentration in the first compound region, the first compound region Al concentration being higher than a third partial region Al concentration in the third partial region, at least a part of the first compound region being a crystal, the first compound region including a first position, the first position being a center of the first compound region in the second direction;

a second layer including Al, Si, O and N, the second layer including a first intermediate region, the first intermediate region being provided between the first compound region and the first electrode portion in the second direction, a concentration of Si in the first intermediate region being lower than a concentration of Al in the first intermediate region, a concentration of oxygen in the first intermediate region being higher than a concentration of nitrogen in the first intermediate region, the first intermediate region including a second position, the second position being a center of the first intermediate region in the second direction, a second position Al concentration in the second position being lower than a first position Al concentration in the first position, a first ratio of a second position nitrogen concentration in the second position to a second position oxygen concentration in the second position being not less than 0.1 and not more than 0.2; and a first insulating layer including Si and O, the first insulating layer including a first insulating region, the first insulating region being provided between the first intermediate region and the first electrode portion in the second direction.

Configuration 2

The semiconductor device according to Configuration 1, wherein the first ratio is not less than 0.125 and not more than 0.175.

Configuration 3

The semiconductor device according to Configuration 1 or 2, wherein a concentration of Si in the first insulating region is higher than a concentration of Si in the first intermediate region.

Configuration 4

The semiconductor device according to any one of Configurations 1 to 3, wherein the first insulating region does not include Al, or a concentration of Al in the first insulating region is lower than a concentration of Si in the first insulating region.

Configuration 5

The semiconductor device according to any one of Configurations 1 to 4, wherein at least a part of the first intermediate region is amorphous.

Configuration 6

The semiconductor device according to any one of Configurations 1 to 5, wherein at least a part of the first insulating region is amorphous.

Configuration 7

The semiconductor device according to any one of Configurations 1 to 6, wherein a thickness of the first compound region along the second direction is not less than 1 nm and not more than 10 nm.

Configuration 8

The semiconductor device according to any one of Configurations 1 to 7, wherein a thickness of the first intermediate region along the second direction is not less than 0.5 nm and not more than 7 nm.

Configuration 9

The semiconductor device according to any one of Configurations 1 to 8, wherein at least a part of the first electrode portion is located between the fourth partial region and the fifth partial region in the first direction.

Configuration 10

The semiconductor device according to Configuration 9, wherein:

the first layer further includes a second compound region;

the second layer further includes a second intermediate region;

the first insulating layer further includes a second insulating region;

the second insulating region is located between the first electrode portion and the second semiconductor portion in the first direction;

the second intermediate region is located between the second insulating region and the second semiconductor portion in the first direction; and the second compound region is located between the second intermediate region and the second semiconductor portion in the first direction.

Configuration 11

The semiconductor device according to any one of Configurations 1 to 10, wherein:

the first layer further includes a third compound region, the second layer further includes a third intermediate region;

the first insulating layer further includes a third insulating region;

the second semiconductor portion is located between the fifth partial region and the third insulating region in the second direction;

the third compound region is located between the second semiconductor portion and the third insulating region in the second direction; and the third intermediate region is located between the third compound region and the third insulating region in the second direction.

Configuration 12

The semiconductor device according to Configuration 11, further comprising a second insulating layer, the second insulating layer including at least one selected from the group consisting of oxygen and nitrogen, and at least one selected from the group consisting of Si and Al; and the second insulating layer including a first insulating portion, the first insulating portion being located between the second semiconductor portion and the third compound region.

Configuration 13

The semiconductor device according to Configuration 12, wherein:

the third electrode further includes a second electrode portion;

a position of the second electrode portion in the first direction is between the position of the first electrode portion in the first direction and the position of the second electrode in the first direction;

the second electrode portion is continuous with the first electrode portion;

a part of the second semiconductor portion is provided between the fifth partial region and the second electrode portion in the second direction; and a part of the third compound region, a part of the third intermediate region and a part of the third insulating region are located between the first insulating region and the second electrode region in the second direction.

Configuration 14

The semiconductor device according to Configuration 13, wherein:

the third electrode further includes a third electrode portion, the third electrode portion is located between the first electrode portion and the second electrode portion;

the third electrode portion is continuous with the first electrode portion and the second electrode portion;

the part of the second semiconductor portion is provided between the fifth partial region and the third electrode portion in the second direction; and another part of the third compound region is located between the first electrode portion and the first insulating portion in the first direction.

Configuration 15

The semiconductor device according to Configuration 14, wherein the other part of the third compound region is in contact with the second semiconductor portion.

Configuration 16

The semiconductor device according to Configuration 12, wherein a part of the third compound region is located between the first insulating portion and the second electrode in the first direction.

Configuration 17

The semiconductor device according to Configuration 16, wherein the part of the third compound region is in contact with the second semiconductor portion.

Configuration 18

The semiconductor device according to any one of Configurations 12 to 17, wherein:

the first compound region includes a first face facing the third partial region;

the third compound region includes a second face facing the first insulating portion; and a distance along the second direction between a position of the first face in the second direction and a position of the second face in the second direction is not less than 100 nm and not more than 400 nm.

Configuration 19

The semiconductor device according to any one of Configuration 10 to 18, wherein a distance along the first direction between the first electrode and the first electrode portion is shorter than a distance along the first direction between the first electrode portion and the second electrode.

Configuration 20

The semiconductor device according to any one of Configurations 1 to 19, further comprising a third layer, at least a part of the third layer being located between the first intermediate region and the first insulating region, the third layer including SiN or SiON; and a third thickness of the third layer along the second direction of at least a part of the third layer being not less than 0.1 nm and not more than 2 nm.

According to the embodiment, a semiconductor device capable of obtaining stable characteristics can be provided.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as electrode, semiconductor region, layer and insulating layer, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:

a first electrode;

a second electrode, a direction from the first electrode to the second electrode being along a first direction;

a third electrode, the third electrode including a first electrode portion, a position of the first electrode portion in the first direction being between a position of the first electrode in the first direction and a position of the second electrode in the first direction;

a first semiconductor region including $Al_{x1}Ga_{1-x1}N$ ($0 \leq x1 < 1$), the first semiconductor region including a first partial region, a second partial region, a third partial region, a fourth partial region and a fifth partial region, a direction from the first partial region to the first electrode being along a second direction crossing the first direction, a direction from the second partial region to the second electrode being along the second direction, a direction from the third partial region to the first electrode portion being along the second direction, a position of the fourth partial region in the first direction being between a position of the first partial region in the first direction and a position of the third partial region in the first direction, a position of the fifth partial region in the first direction being between the position of the third partial region in the first direction and a position of the second partial region in the first direction;

a second semiconductor region including $Al_{x2}Ga_{1-x2}N$ ($x1 < x2 \leq 1$), the second semiconductor region including a first semiconductor portion and a second semiconductor portion, a direction from the fourth partial region to the first semiconductor portion being along the second direction, a direction from the fifth partial region to the second semiconductor portion being along the second direction;

a first layer including Al and N, the first layer including a first compound region, the first compound region being provided between the third partial region and the first electrode portion in the second direction, the first compound region not including oxygen, or a concentration of oxygen in the first compound region being lower than a concentration of nitrogen in the first compound region, the first compound region not including Ga, or a first compound region Ga concentration in the first compound region being lower than a first compound region Al concentration in the first compound region, the first compound region Al concentration being higher than a third partial region Al concentration in the third partial region, at least a part of the first compound region being a crystal, the first compound region including a first position, the first position being a center of the first compound region in the second direction;

a second layer including Al, Si, O and N, the second layer including a first intermediate region, the first intermediate region being provided between the first compound region and the first electrode portion in the second direction, a concentration of Si in the first intermediate region being lower than a concentration of Al in the first intermediate region, a concentration of oxygen in the first intermediate region being higher than a concentration of nitrogen in the first intermediate region, the first intermediate region including a second position, the second position being a center of the first intermediate region in the second direction, a second position Al concentration in the second position being lower than a first position Al concentration in the first position, a first ratio of a second position nitrogen concentration in the second position to a second position oxygen concentration in the second position being not less than 0.1 and not more than 0.2; and a first insulating layer including Si and O, the first insulating layer including a first insulating region and a third insulating region, the first insulating region being provided between the first intermediate region and the first electrode portion in the second direction, wherein at least a part of the first electrode portion is located between the fourth partial region and the fifth partial region in the first direction, the first layer further includes a third compound region located between the second semiconductor portion and the third insulating region in the second direction, the device further includes a second insulating layer including a first insulating portion, the first compound region includes a first face facing the third partial region, the third compound region includes a second face facing the first insulating portion, a distance along the second direction between a position of the first face in the second direction and a position of the second face in the second direction is not less than 100 nm and not more than 400 nm, and the distance corresponds to a depth of a recess of a structure that includes the first semiconductor region, the second semiconductor region and the first insulating portion.

2. The device according to claim 1, wherein the first ratio is not less than 0.125 and not more than 0.175.

3. The device according to claim 1, wherein a concentration of Si in the first insulating region is higher than the concentration of Si in the first intermediate region.

4. The device according to claim 1, wherein the first insulating region does not include Al, or a concentration of Al in the first insulating region is lower than a concentration of Si in the first insulating region.

5. The device according to claim 1, wherein at least a part of the first intermediate region is amorphous.

6. The device according to claim 1, wherein at least a part of the first insulating region is amorphous.

7. The device according to claim 1, wherein a thickness of the first compound region along the second direction is not less than 1 nm and not more than 10 nm.

8. The device according to claim 1, wherein a thickness of the first intermediate region along the second direction is not less than 0.5 nm and not more than 7 nm.

9. The device according to claim 1, wherein:

the first layer further includes a second compound region;

the second layer further includes a second intermediate region;

the first insulating layer further includes a second insulating region;

the second insulating region is located between the first electrode portion and the second semiconductor portion in the first direction;

the second intermediate region is located between the second insulating region and the second semiconductor portion in the first direction; and the second compound region is located between the second intermediate region and the second semiconductor portion in the first direction.

10. The device according to claim 1, wherein:

the second layer further includes a third intermediate region;

the second semiconductor portion is located between the fifth partial region and the third insulating region in the second direction;

the third intermediate region is located between the third compound region and the third insulating region in the second direction.

11. The device according to claim 10, wherein the second insulating layer includes at least one selected from the group consisting of oxygen and nitrogen, and at least one selected from the group consisting of Si and Al; and the first insulating portion is located between the second semiconductor portion and the third compound region.

12. The device according to claim 11, wherein:

the third electrode further includes a second electrode portion;

a position of the second electrode portion in the first direction is between the position of the first electrode portion in the first direction and the position of the second electrode in the first direction;

the second electrode portion is continuous with the first electrode portion;

a part of the second semiconductor portion is provided between the fifth partial region and the second electrode portion in the second direction; and a part of the third compound region, a part of the third intermediate region and a part of the third insulating region are located between the first insulating region and the second electrode portion in the second direction.

13. The device according to claim 12, wherein:

the third electrode further includes a third electrode portion;

the third electrode portion is located between the first electrode portion and the second electrode portion;

the third electrode portion is continuous with the first electrode portion and the second electrode portion;

the part of the second semiconductor portion is provided between the fifth partial region and the third electrode portion in the second direction; and another part of the third compound region is located between the first electrode portion and the first insulating portion in the first direction.

14. The device according to claim 13, wherein the other part of the third compound region is in contact with the second semiconductor portion.

15. The device according to claim 11, wherein a part of the third compound region is located between the first insulating portion and the second electrode in the first direction.

16. The device according to claim 15, wherein the part of the third compound region is in contact with the second semiconductor portion.

17. The device according to claim 9, wherein a distance along the first direction between the first electrode and the first electrode portion is shorter than a distance along the first direction between the first electrode portion and the second electrode.

18. The device according to claim 1, further comprising a third layer, at least a part of the third layer being located between the first intermediate region and the first insulating region, the third layer including SiN or SiON; and a third thickness of the third layer along the second direction of at least a part of the third layer being not less than 0.1 nm and not more than 2 nm.

* * * * *